(12) United States Patent
Kadokura

(10) Patent No.: US 6,911,123 B2
(45) Date of Patent: Jun. 28, 2005

(54) FACING-TARGETS-TYPE SPUTTERING APPARATUS AND METHOD

(75) Inventor: Sadao Kadokura, Hachioji (JP)

(73) Assignee: FTS Corporation, Hachioji (JP)

( * ) Notice: Subject to any disclaimer, the term of this patent is extended or adjusted under 35 U.S.C. 154(b) by 281 days.

(21) Appl. No.: 09/998,235

(22) Filed: Dec. 3, 2001

(65) Prior Publication Data

US 2002/0066669 A1 Jun. 6, 2002

(30) Foreign Application Priority Data

Dec. 5, 2000 (JP) ........................................ 2000-369655

(51) Int. Cl.[7] ............................................. C23C 14/35
(52) U.S. Cl. ........................... 204/192.15; 204/192.12; 204/298.06; 204/298.08; 204/298.12; 204/298.17
(58) Field of Search ....................... 204/192.12, 192.15, 204/298.12, 298.09, 298.08, 298.16, 298.17, 298.18, 298.06

(56) References Cited

U.S. PATENT DOCUMENTS

| | | | |
|---|---|---|---|
| 4,407,894 A | 10/1983 | Kadokura et al. | 428/457 |
| 4,784,739 A | 11/1988 | Kadokura et al. | 204/192.2 |
| 4,842,708 A | 6/1989 | Kadokura et al. | 204/298.16 |
| 4,931,169 A * | 6/1990 | Scherer et al. | 204/298.11 |
| 6,156,172 A * | 12/2000 | Kadokura | 204/298.26 |
| 6,328,857 B1 * | 12/2001 | Anzaki et al. | 204/192.12 |

OTHER PUBLICATIONS

Proceedings: The 61st Symposium of the Japan Society of Applied Physics, Sep. 2000, 5a–P8–5, 5a–P8–6 (Translation attached).
Abridged translation for JP 62–14633, JP 63–20303, H4–11624, H10–8246.

* cited by examiner

Primary Examiner—Steven H. VerSteeg
(74) Attorney, Agent, or Firm—Armstrong, Westerman & Hattori, LLP (57) ABSTRACT

Disclosed is a facing-targets-type sputtering apparatus and method capable of forming a metal film under the conditions of low gas pressure and low discharge voltage. An opening is formed in each of two facing side faces of a vacuum chamber vessel or in each of two facing side faces of a box-type discharge unit attached to an opening portion of a vacuum chamber vessel. The two openings are covered by a pair of cooling blocks. Each cooling block holds a target facing a discharge space. Magnetic field generation means is disposed so as to surround each target and operative to generate a magnetic field that surrounds a discharge space provided between the paired targets. Electron reflection means is disposed above the exposed surface of each target along the periphery of the target. A DC power and a high-frequency power are applied between the vacuum chamber vessel and the targets.

17 Claims, 5 Drawing Sheets

FACING-TARGETS-TYPE SPUTTERING APPARATUS AND METHOD

BACKGROUND OF THE INVENTION

1. Field of the Invention

The present invention relates to an improvement in a facing-targets-type sputtering apparatus configured such that a pair of facing targets are disposed a predetermined distance away from each other and such that a magnetic field extending between the targets from one target to the other is generated in such a manner as to surround a space provided between the facing targets (the space is hereinafter called a discharge space) to thereby confine plasma within the discharge space and to form a film on a substrate disposed at a position beside the discharge space under vacuum, as well as to an improvement in a sputtering method using the apparatus. Particularly, the invention relates to a facing-targets-type sputtering apparatus and method capable of adjusting a sputtering voltage over a wide range.

2. Description of the Related Art

Figure 1:
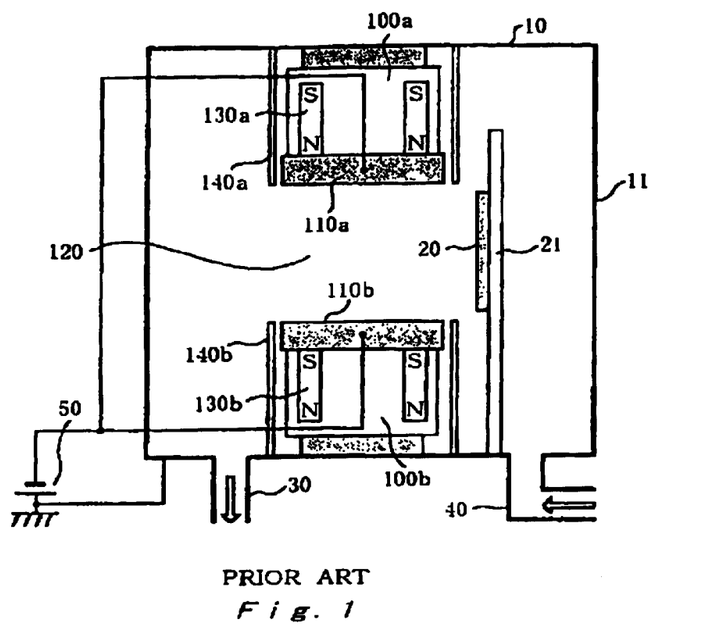
FIG. 1 is a schematic sectional view showing the basic configuration of a conventional facing-targets-type sputtering apparatus.

A facing-targets-type sputtering method is disclosed in patent applications previously filed by the present inventors (Japanese Publication of Examined Patent Application (kokoku) Nos. S63-20303, S63-20304, and S62-14633). An apparatus used in the method is shown in FIG. 1. As shown in FIG. 1, the apparatus has the following basic configuration. Targets 110a and 110b are disposed a predetermined distance away from each other within a vacuum chamber vessel 10 having a chamber wall 11, thereby defining a discharge space 120 therebetween. Magnetic-field generation means 130a and 130b are disposed behind the corresponding targets 110a and 110b in order to generate a magnetic field which extends between the targets 110a and 110b from one target to the other and whose flux uniformly surrounds the discharge space 120. A substrate holder 21 disposed at a position beside the discharge space 120 holds a substrate 20 such that the substrate 20 faces the discharge space 120. Reference numerals 140a and 140b denote shields for protecting from sputtering portions of target units 100a and 100b other than the front surfaces of the targets 110a and 110b.

After the vacuum chamber vessel 10 is evacuated through an evacuation port 30 by means of an unillustrated evacuation system, a sputtering gas, such as argon, is introduced into the vacuum chamber vessel 10 through a gas inlet 40 by means of an unillustrated gas introduction means. As shown in FIG. 1, a DC power supply 50 serving as a sputtering power supply supplies sputtering power to the apparatus while the shields 140a and 140b; i.e., the vacuum chamber vessel 10, serve as an anode (ground) and the targets 110a and 110b serve as a cathode. Thus, sputtering plasma is generated while being confined within the discharge space 120 by means of the magnetic field. The sputtering plasma effects sputtering of the targets 110a and 110b, thereby forming on the substrate 20 a thin film whose composition corresponds to that of the targets 110a and 110b.

According to the method, since the magnetic field extends in the direction extending between the targets 110a and 110b; i.e., perpendicularly to the targets 110a and 110b, high-energy electrons are confined within the discharge space 120 so as to generate sputtering plasma. The sputtering plasma accelerates ionization of the sputtering gas, thereby increasing a sputtering rate and thus forming a film at high rate. In contrast to a typical conventional magnetron type sputtering method, in which a substrate is disposed in opposition to a target, the substrate 20 is disposed at a position beside the targets 110a and 110b. Accordingly, ions and electrons impinging on the substrate 20 are greatly reduced. Also, thermal radiation from the targets 110a and 110b to the substrate 20 is low, so that an increase in substrate temperature becomes small. Thus, a film can be formed at low temperature. In contrast to a conventional magnetron-type sputtering method, which encounters difficulty in forming a film of magnetic material at high rate, the facing-targets-type sputtering method can form a film of various materials including magnetic material at low temperature and at high rate and has thus been utilized for manufacturing, for example, a magnetic thin film, a thin-film-type magnetic recording medium, a magnetic head, a metal film and a metal-oxide film.

The facing-targets-type sputtering method usually uses square or circular targets. However, regardless of the target shape, a target tends to be sputtered intensively at a central portion of the target surface, and thus the necessity to improve target utilization efficiency has now been recognized. When a rectangular target is used, a target erosion pattern asymmetrical with respect to a central portion thereof results. As a result, variation in film thickness arises in a width direction of the substrate, indicating the necessity to improve productivity and uniformity of film thickness.

In order to cope with the above-described problems, the present inventors have proposed technology for expanding a sputtering region to the entire target surface in Japanese Publication of Examined Patent Application (kokoku) Nos. H03-2231 and S63-54789. Specifically, magnetic field generation means is disposed around the periphery of a target, and a core is disposed at an end portion of the magnetic field generation means; i.e., at an end portion of a magnetic pole, whereby a magnetic field is formed around the periphery of the target. According to the configuration, since a magnetic field is directly generated between the facing cores without involvement of the targets, magnetic field distribution becomes unlikely to be affected by the magnetic permeability and saturation magnetization of a target material and target thickness. Also, the magnetic field for confinement of sputtering plasma is formed around the periphery of a target, so that a sputtering region expands from a central portion of the target to a peripheral edge portion of the target, thereby greatly improving target utilization efficiency. However, the proposed configuration involves a drawback in that, since a discharge voltage increases during sputtering, stable sputtering requires high sputtering gas pressure.

In order to solve the above problem, the present inventors have proposed technology for improving a feature of the facing-targets-type sputtering method; i.e., technology for more uniformly confining the plasma over the entire surface of a target, in Japanese Publication of Examined Patent Application (kokoku) Nos. H04-11624 and H05-75827. In order to generate and confine sputtering plasma, the proposed technology employs electron reflection means for reflecting electrons toward a space in the vicinity of a peripheral edge portion of the surface of a target in addition to means for generating magnetic flux (magnetic field) extending perpendicularly to the surface of a target as employed in a conventional facing-targets-type sputtering apparatus. According to the proposed technology, high-energy electrons drift within a space provided between a pair of facing targets while a magnetic field formed in the vicinity of a peripheral edge portion of the target allows electrons to continue drifting in the vicinity of a peripheral edge portion of the target without being absorbed by a shield located in the vicinity of a magnetic pole. Thus, the ionization efficiency of a sputtering gas is significantly enhanced to thereby solve the above-mentioned problem.

As a result, sputtering efficiency is enhanced over the entire surface of a target. The sputtering technology can form a thin film of very fine structure with excellent characteristics as compared with the case of a conventional magnetron type sputtering method in which a substrate and a sputtering source face each other and which cannot form such a thin film. Also, the technology realizes uniform erosion of a target over its entire surface. Even when a rectangular target is sputtered, symmetry of a target erosion pattern with respect to a central portion of the target is drastically improved.

However, even in the improved facing-targets-type sputtering apparatus, as before, particles sputtered from a target and recoiled gas particles associated with sputtering scatter into a vacuum chamber from all side faces of a space provided between the facing targets. Accordingly, although the improved apparatus exhibits advantages that the front surface of a target is sputtered uniformly and that a thin film having a uniform thickness can be formed on a substrate in a well-controlled condition, the apparatus still involves drawbacks, in that merely a portion of all side faces of the space between the targets that faces the substrate can be used for formation of the thin film and that the gas contained in the walls by particles impinging on vacuum chamber walls is released during sputtering, resulting in an impairment in the quality of the thin film formed on the substrate.

In order to cope with the above problems, the present inventor proposed a box-type facing-targets-type sputtering apparatus in Japanese Laid-open Patent Publication (kokai) No. H10-8246. In the apparatus, five targets define a box-type discharge space such that one side face of the box-type discharge space is open to a substrate. Specifically, a pair of first targets are disposed a predetermined distance away from each other in a facing condition. Three second targets are disposed in the shape of a squarish letter U lying on its side to thereby define, in combination with the paired first targets, a box-type discharge space having an opening portion which faces a substrate. Magnetic field generation means is disposed in the vicinity of the periphery of each first target such that magnetic poles of one first target face the corresponding magnetic poles of the other first target, for the purpose of generating a magnetic field for confinement of sputtering plasma. The magnetic field generation means generates magnetic fields of the following modes: a tubular facing-mode magnetic field extending between and surrounding the first targets; an ordinary magnetron-mode magnetic field which is generated in the vicinity of the inner surface of a peripheral edge portion of each first target so that magnetic lines extend arcuately from the magnetic pole toward the inner surface; a mirror-type magnetron-mode magnetic field extending in parallel with and in the vicinity of the surface of each second target; and magnetron-mode magnetic fields which are generated in the vicinity of the inner surfaces of opposed side edge portions of each second target adjacent to the corresponding magnetic field generation means so that magnetic fields extend arcuately from the magnetic poles toward the inner surfaces. Also, electron reflection means is provided at each of the following positions: end portions of the second targets which partially define the opening portion of the discharge space; and magnetic-pole end portions of the magnetic field generation means which face the discharge space. The thus-configured apparatus forms a thin film on a substrate disposed in front of the opening portion of the discharge space, by use of sputtering plasma generated within the discharge space.

As mentioned above, the paired facing first targets and the three second targets define a box-type discharge space having the opening portion facing a substrate. By employment of the box-type discharge space and the electron reflection means, electrons are confined by means of the above-mentioned magnetic fields and interact with one another, thereby generating and confining high-density plasma expanding over substantially the entire surface of each target. Thus, substantially the entire surface of each target is uniformly sputtered, thereby solving the aforementioned problems.

However, the above-mentioned facing-targets-type sputtering method has been found to involve the following problem. When a film is formed on a film that has been formed previously, the quality of the previously formed film is impaired in some cases ,for example the case which the previously formed film is an organic material. An investigation as to the cause of the impairment revealed that a sputtering voltage; i.e., a discharge voltage, is responsible. An increase in discharge voltage increases kinetic energy of recoiled gas particles and the strength of an accelerating electric field for negative ions in a cathode sheath. The accelerating electric field in a cathode sheath brings about disturbance on a process of arranging sputtered particles on deposition surface when the deposited film consists of organic materials or oxides, or involves rare earth elements. A discharge voltage depends on, for example, a gas pressure and the mechanical layout of target units. Since, for example, a change in gas pressure influences the quality of a formed film, the adjustment of the discharge voltage has been difficult.

Recently, in the area of advanced thin films, there has been desired formation of a film under high vacuum; i.e., without influence of sputtering gas. This is particularly desired in production of LSIs and like devices, in order to highly reliably form a conductive film on the wall of a contact hole of high aspect ratio having a submicron or sub-half-micron diameter.

SUMMARY OF THE INVENTION

An object of the present invention is to provide a sputtering method for forming a metal film of uniform thickness and high quality which is suitable for production of LSIs and like devices. Another object of the present invention is to provide a sputtering method capable of forming a film under high vacuum. Still another object of the present invention is to provide a sputtering method allowing wide-range adjustment of discharge voltage for sputtering and, particularly, capable of forming a film stably even at low discharge voltage.

To achieve the above objects, the present invention provides a facing-targets-type sputtering apparatus comprising a vacuum chamber vessel having two openings formed in two corresponding facing faces thereof; a pair of target units disposed so as to cover the corresponding two openings, each unit having a target on the vacuum chamber side; a substrate holder for holding a substrate disposed at a position beside a discharge space provided between the paired targets; and a power supply unit for supplying direct-current power and high-frequency power to the paired targets. The paired target units each comprises a target disposed on the front side thereof; a cooling block for holding the corresponding target on the surface thereof; magnetic field generation means for generating a magnetic field in such a manner as to surround the discharge space; and electron reflection means disposed on the magnetic field generation means in such a manner as to surround the corresponding target.

To achieve the aforementioned objects, the present invention also provides a facing-targets-type sputtering apparatus comprising a box unit having a discharge space provided therein and having at least three openings formed in three corresponding side faces thereof including two facing side faces; a pair of target units disposed so as to cover the corresponding two facing openings, each unit having a target disposed on the discharge space side; a substrate holder for holding a substrate in such a manner as to cause the substrate to face the opening not covered with the target unit; and a power supply unit for supplying direct-current power and high-frequency power to the paired targets. The paired target units each comprises a cooling block for holding the corresponding target on the surface thereof; magnetic field generation means for generating a magnetic field in such a manner as to surround a discharge space provided between the paired targets; and electron reflection means disposed on the magnetic field generation means in such a manner as to surround the corresponding target.

To achieve the aforementioned objects, the present invention also provides a facing-targets-type sputtering method comprises (a)generating, between a pair of facing targets disposed a predetermined distance away from each other, a magnetic field extending from one target to the other in such a manner as to surround a discharge space provided between the paired targets, to thereby confine plasma within the discharge space by means of the magnetic field; and(b) performing sputtering under vacuum so as to form a film on a substrate disposed at a position beside the discharge space, wherein electrons are caused to be reflected into the discharge space by use of electron reflection means disposed around the corresponding targets, and power generated through superposition of high-frequency power to direct-current power is applied to the targets to effect the sputtering.

The present invention has been achieved in the following manner. Focusing on a sputtering power supply in relation to the aforementioned problems, the present inventor has studied the use of a high-frequency power supply in place of a conventionally used DC power supply and have found that, even in a facing-targets-type sputtering process, a discharge voltage and an applied RF power are in inverse proportion to each other. Thus, the present inventor has carried out intensive studies on the feasibility of adjustment of a discharge voltage by means of a high-frequency component of an applied power generated through addition of high frequency to certain direct current, and have found that, through employment of the electron reflection means, a discharge voltage can be readily adjusted by means of a high-frequency component. The present invention has been achieved on the basis of these findings.

Employment of the electron reflection means yields such an astonishing effect, conceivably for the following reason. The electron reflection means efficiently reflects electrons back into the discharge space, thereby promoting ionization; i.e., allowing an added high-frequency power to function for increasing ion density, resulting in a substantial decrease in space impedance. When the electron reflection means is not employed, electrons leak out from a region corresponding to the electron reflection means. As a result, a high-frequency power component fails to yield such an effect.

Preferably, in addition to the magnetic field extending between the targets from one target to the other, a circular arc magnetic field is generated at a peripheral edge portion of each target. Through generation of the circular arc magnetic field, the plasma is more efficiently confined within the discharge space.

Thus, in the present invention, a discharge voltage can be adjusted by means of either a direct-current component or a high-frequency component of an applied power. No particular limitation is imposed on the ratio between the direct-current component and the high-frequency component. Notably, no particular limitation is imposed on the frequency of a high-frequency power, so long as ionization is accelerated. Usually, a frequency of tens of kHz to 50 MHz is used. Particularly, employment of radio frequency, RF, is convenient.

Notably, the present invention is preferably applied to formation of a metal film, particularly a Cu film, a Cu alloy film, an Al film, or an Al alloy film. Also, the present invention is preferably applied to formation of a wiring film on a semiconductor substrate involving formation of a film on the wall of a very fine hole of high aspect ratio. Preferably, a film is formed under high vacuum at a gas pressure of 0.05 Pa or lower, in view of prevention of such a bad effect of sputtering gas bombarding a formed film surface; i.e., prevention of damage to the interface of a deposited layer. Through employment of a box-type sputtering unit and a sputtering gas pressure of 0.01 Pa or lower as in Experiment 3, the method of the present invention can form a film on the wall of a very fine hole and is thus favorably applicable to formation of a wiring film on a semiconductor substrate to be used in production of an LSI.

The foregoing and other objects of the present invention, together with its novel features, will become more apparent when the following detailed description is read with reference to the accompanying drawings.

DESCRIPTION OF THE PREFERRED EMBODIMENTS

The invention will next be described with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 2A:
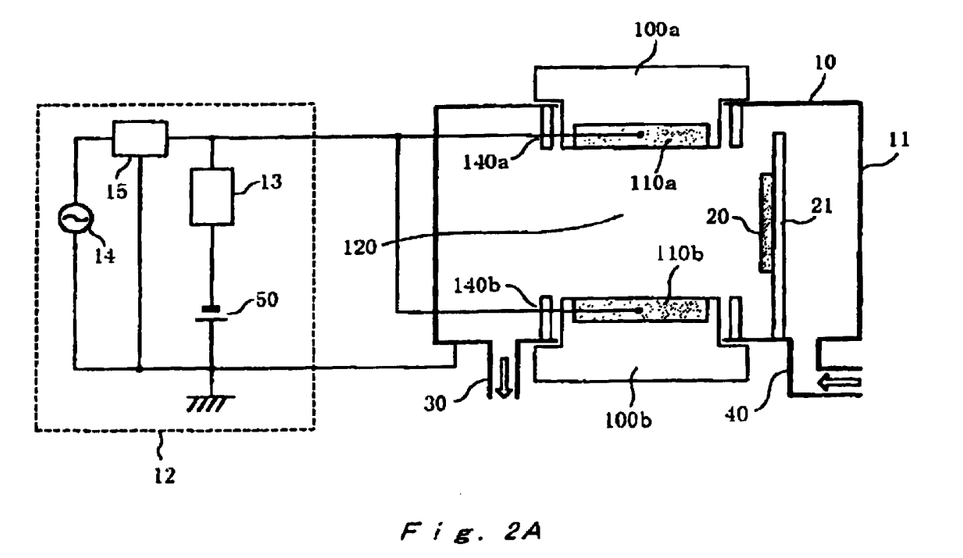
FIG. 2A is a schematic sectional view showing a facing-targets-type sputtering apparatus according to a first embodiment of the present invention.

FIG. 2A is a schematic sectional view showing a first embodiment of the present invention. The present embodiment differs from the conventional apparatus of FIG. 1 in the configuration of target units 100*a* and 100*b* and in power supply—the present embodiment uses a DC power supply and a high-frequency power supply for applying power between a vacuum chamber vessel 10 and the targets 110*a* and 110*b*, whereas the conventional apparatus uses only a DC power supply. Features common between the present embodiment and the conventional apparatus are denoted by common reference numerals, and repeated description is omitted. According to the present embodiment, openings are formed in two corresponding facing chamber walls 11 of a vacuum chamber vessel 10. Target units 100*a* and 100*b* are mounted to cover the openings (the configuration of the target units 100*a* and 100*b* will be described later in detail). A power unit 12 applies power between the vacuum chamber vessel 10 and targets. Specifically, a DC power supply 50 supplies DC power through a low-pass filter 13, and a high-frequency power supply 14 supplies a high-frequency power through a matching circuit 15.

Figure 2B:
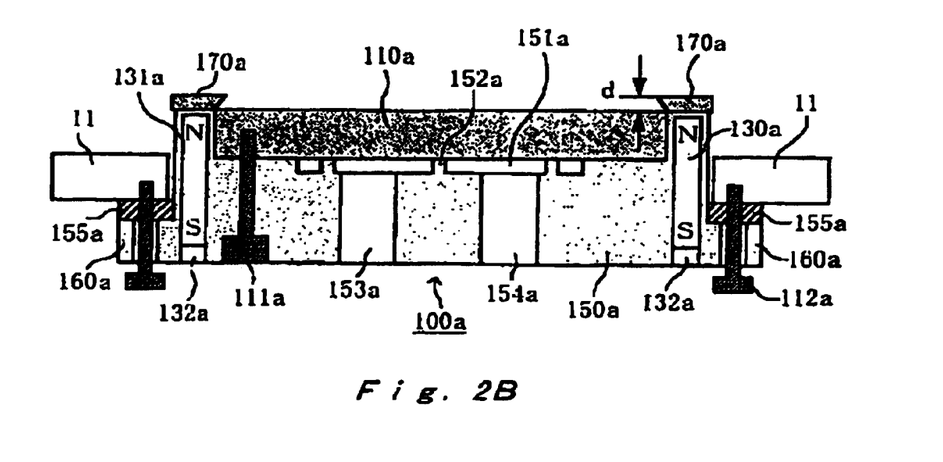
FIG. 2B is a schematic vertical sectional view showing a target unit of the sputtering apparatus of FIG. 2A.

FIG. 2B is a vertical sectional view of the target unit 100*a* which partially constitutes the facing-targets arrangement of the sputtering apparatus of the present embodiment shown in FIG. 2A. The target unit 100*a* assumes a configuration similar to that disclosed by the present inventor in Japanese Laid-open Patent Publication (kokai) No. H10-330936 (U.S. Pat. No. 6,156,172). The publication calls a counterpart of the present invention's electron reflection means an electron trap plate while focusing attention on the action of trapping electrons in a discharge space rather than the action of reflecting electrons back into the discharge space.

The target units 100*a* and 100*b* of the facing-targets arrangement are configured as shown in FIG. 2B. The target units 100*a* and 100*b* assume the same configuration except that the N and S magnetic poles of magnetic field generation means are arranged in reverse as shown in FIG. 1. The following description covers only the target unit 100*a* shown in FIG. 2B.

A target 110*a* is removably mounted on the front surface of a cooling block 150*a* serving as a support member by means of bolts 111*a* arranged at certain intervals in a peripheral region of the cooling block 150*a*. The target 110*a* generally assumes a circular or rectangular shape. The shape of a target reception portion of the cooling block 150*a* is determined accordingly. A recess is formed on the front surface of the cooling block 150*a* and divided into a cooling groove 151*a* by a partition wall 152*a*, thereby forming a cooling jacket for directly cooling the mounted target 110*a* from behind as shown in FIG. 2B. Thus, cooling can be carried out highly efficiently, thereby allowing high-rate film formation. The cooling block 150*a*; i.e., the target unit 100*a*, is removably mounted on the chamber wall 11; specifically, a mounting portion 160*a* of the cooling block 150*a* is mounted on the chamber wall 11 via a packing 155*a* made of a electrically insulating material by means of bolts 112*a* arranged at certain intervals.

The cooling block 150*a* is configured in the following manner. A magnet housing portion 131*a* for housing a permanent magnet 130*a* of the magnetic field generation means is formed along the periphery of the target 110*a* in a surrounding condition. A platelike electron reflection means 170*a* is provided on the front end face of the magnet housing portion 131*a* while projecting into the interior of the vacuum chamber vessel 10 by a predetermined effective length d as measured from the front surface of the target 110*a*. In the case of the target 110*a* made of a magnetic material, through use of the electron reflection means 170*a* made of a magnetic material, the electron reflection means 170*a* serves as a magnetic pole end of the magnetic field generation means, thereby generating a circular arc magnetic field extending from the electron reflection means 170*a* to the surface of a peripheral edge portion of the target 110*a*. In the case of the target 110*a* made of a non-magnetic material, even when the electron reflection means 170*a* is made of a nonmagnetic material, a magnetic field extending between the magnetic poles of the permanent magnet 130*a* generates a circular arc magnetic field at the surface of a peripheral edge portion of the target 110*a*.

As shown in FIG. 2B, the magnet housing portion 131*a* is configured in the following manner. A plurality of bores having a predetermined depth are formed in the cooling block 150*a* while being arranged at predetermined intervals and opening to the exterior of the vacuum chamber vessel 10 in order to allow removable insertion of the permanent magnets 130*a* of the magnetic field generation means thereinto. The magnetic field generation means is configured in the following manner. A plurality of rodlike permanent magnets 130*a* are inserted into the corresponding bores of the magnet housing portion 131*a* and fixed in place by means of the corresponding retainers 132*a* while being oriented as shown in FIG. 2B, thereby being arranged at predetermined intervals around the target 110*a*.

The cooling block 150*a* assuming an integral structure and having the magnet housing portion 131*a* and the mounting portion 160*a* is manufactured in the following manner. A block of a structural material having good thermal conductivity, such as metal; in the present embodiment, an aluminum block, is machined into a shape having the cross section of FIG. 2B by use of a numerically controlled machining machine. Through-bores for the bolts 111*a* and 112*a* are drilled in the block at predetermined positions at predetermined intervals. Bores serving as the magnet housing portion 131*a* for housing the permanent magnets 130*a* of the magnetic field generation means are drilled, at the bottom side of the block, by a predetermined depth in a peripheral edge portion of the block at predetermined positions arranged at predetermined intervals. Thus is obtained a block of a seamless integral structure. The structure establishes complete isolation between the interior and the exterior of the vacuum chamber vessel 10 to thereby prevent entry of the ambient atmosphere into the vacuum chamber vessel 10. Since cooling water flows through the cooling groove 151*a* via cooling water passes 153*a* and 154*a*, the permanent magnets 130*a* housed in the magnet housing portion 131*a* can be sufficiently cooled merely through thermal conduction.

As mentioned previously, the electron reflection means 170*a*—adapted to reflect approaching electrons back into the discharge space for trapping the electrons within the space— is provided on an end of the magnet housing portion 131*a* facing the interior of the vacuum chamber vessel 10, in such a manner as to surround the target 110*a*. When the composition of a film to be formed must be controlled strictly, the electron reflection means 170*a* must be made of the same material as that of the target 110*a*, since, even when the electron reflection means 170*a* is sputtered, sputtered particles do not affect the composition of the film. However, in a facing-targets-type sputtering process, because of the nature of magnetic flux generated via the electron reflection means 170*a*, the electron reflection means 170*a* remains virtually unsputtered. Thus, material for the electron reflection means 170*a* is not particularly limited.

As described above, in the present embodiment, the target unit 100*a* is entirely configured on the cooling block 150*a* serving as a support. As mentioned previously, the mounting portion 160a is mounted on the chamber wall 11 of the vacuum chamber vessel 10 via the packing 155a made of an electrically insulating material by means of the bolts 112a arranged at certain intervals, thereby mounting the target unit 100a on the chamber wall 11.

The target 110a is also mounted on the cooling block 150a via an O-ring packing (not shown) made of an electrically insulating material by means of the bolts 111a. As mentioned previously, since the cooling block 150a exhibits excellent thermal conductivity, even when the target surface is exposed to high-density plasma, cooling by means of the cooling groove 151a suppresses temperature rise, thereby preventing impairment in packing and thus establishing highly reliable sealing.

The thus-configured target unit 100a and the target unit 100b—in which magnetic poles of the permanent magnets 130a of the magnetic field generation means are reversed with those of the target unit 100a—are disposed in the sputtering apparatus of FIG. 2A.

The sputtering apparatus of FIG. 2A operates in the following manner. After the vacuum chamber vessel 10 is evacuated through an evacuation port 30 by use of an evacuation system, sputtering gas, such as argon, is introduced into the vacuum chamber vessel 10 through an introduction port 40 by use of gas introduction means. The power unit 12 including the DC power supply 50 and the high-frequency power supply 14 supplies sputtering power such that the vacuum chamber vessel 10 serves as an anode (ground) while the targets 110a and 110b serve as cathodes. As a result, sputtering plasma is generated and confined within a discharge space 120 by means of a magnetic field generated by the permanent magnets 130a and 130b of the magnetic field generation means. The bombardment of ionized sputtering gas in the sputtering plasma effects sputtering of the targets 110a and 110b, thereby forming on the substrate 20 a film having a composition corresponding to that of the targets 110a and 110b.

In the sputtering apparatus, since the electron reflection means 170a having the same electric potential as that of the target 110a reflects approaching electrons back into the discharge space 120 so as to trap the electrons within the discharge space 120, high-density plasma is generated. Furthermore, the electron reflection means 170a serves as a magnetic pole end of the magnetic field generation means, thereby generating a magnetic field extending from the electron reflection means 170a to the surface of a peripheral edge portion of the target 110a. As a result, as in the case of a magnetron-type sputtering process, a sputtering region of a magnetron mode is formed at the peripheral edge portion of the targets 100a, 100b. Thus is implemented a facing-targets-type sputtering process featuring high-rate film formation and high target utilization efficiency.

Second Embodiment

Figure 3:
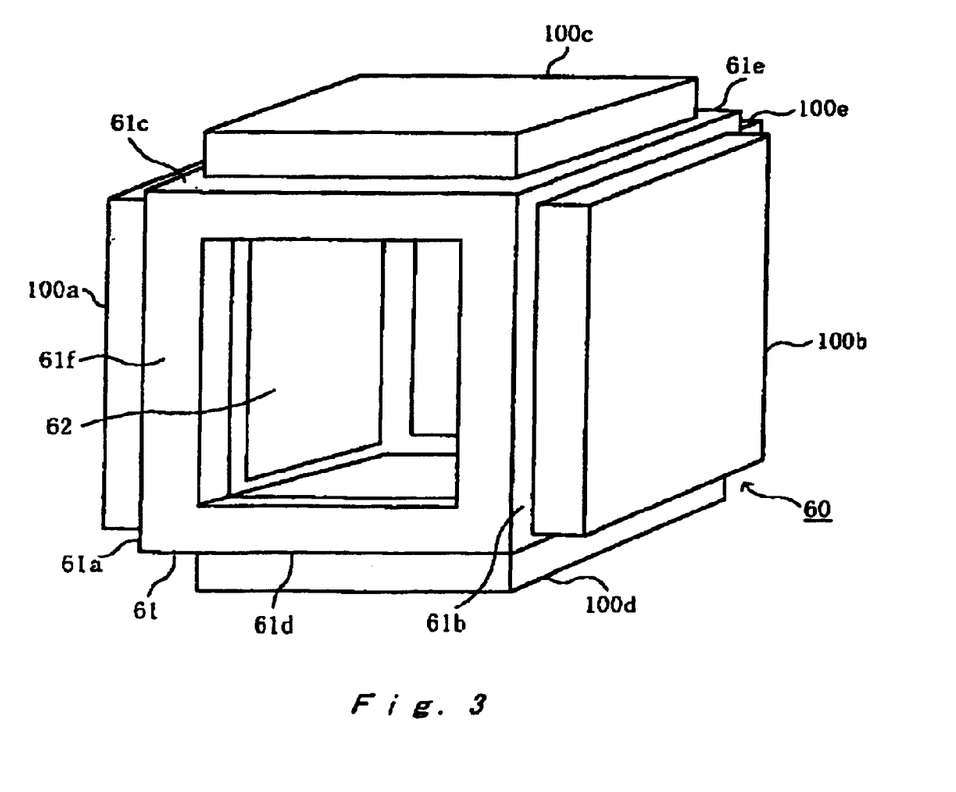
FIG. 3 is a schematic perspective view showing a box-type sputtering unit according to a second embodiment of the present invention.
Figure 4:
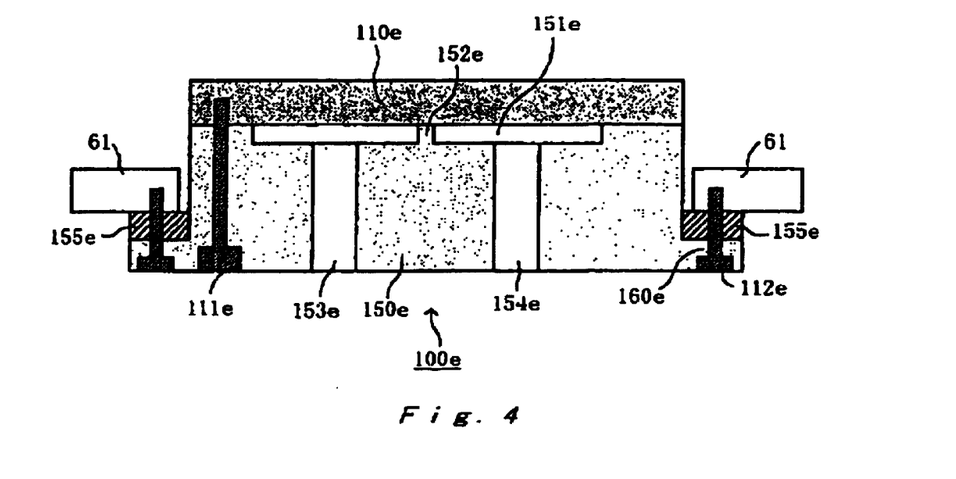
FIG. 4 is a schematic vertical sectional view showing a target unit other than a pair of facing target units used in the box-type sputtering unit of FIG. 3.

A facing-targets-type sputtering apparatus according to a second embodiment of the present invention is configured in the following manner. A box-type sputtering unit similar to that disclosed in aforementioned Japanese Laid-open Patent Publication (kokai) No. H10-8246 is mounted on a wall of a vacuum chamber vessel while a substrate faces an opening portion of the sputtering unit. FIG. 3 is a perspective view showing a box-type sputtering unit used in the facing-targets-type sputtering apparatus of the present embodiment. FIG. 4 is a vertical sectional view showing a target unit other than a pair of facing target units used in the box-type sputtering unit. A sputtering power supply assumes the form of a DC-high-frequency power supply composed of a DC power supply and a high-frequency power supply, thereby supplying a power having a DC component and a high-frequency component.

The box-type sputtering unit 60 is configured as shown in FIG. 3. Specifically, the box-type sputtering unit 60 includes a support frame 61 assuming the shape of a rectangular parallelepiped. Side faces 61a to 61e of the support frame 61 are tightly covered as described below while a side face 61f has an opening portion 62 formed therein. In FIG. 3, the target unit 100a of FIG. 2B and the target unit 100b—in which magnetic poles of the permanent magnets 130a are reversed with those of the target unit 100a—are attached to the side faces 61a and 61b at the left and right, respectively, of the opening portion 62, thereby tightly covering the side faces 61a and 61b and establishing the facing-targets arrangement (that is, the target unit 100a of FIG. 2B is attached to the support frame 61 in place of the chamber wall 11). The side faces 61c and 61d located above and below, respectively, of the opening portion 62 are tightly covered with platelike closing units 100c and 100d. In FIG. 3, the side face 61e located on the far side of the page is tightly covered with a target unit 100e not having the magnetic field generation means and electron reflection means as shown in FIG. 4. Thus is established a box-type configuration in which only the side face 61f is open. Sputtering gas introduction ports (not shown) are provided in the side face 61e while being arranged around the target unit 100e, so as to directly supply sputtering gas into the interior space of the sputtering unit 60.

As shown in FIG. 4, the target unit 100e is similar to the target unit 100a of FIG. 2B except that the magnetic field generation means 130a, the magnet housing portion 131a, and the electron reflection means 170a are not provided. Features of the target unit 100e are denoted by common reference numerals, and their repeated description is omitted (notably, a subscript indicative of the position of a target unit is changed from letter a to letter e).

Formation of a magnetic field for generating and confining sputtering plasma within the box-type sputtering unit 60 of FIG. 3 is basically similar to that disclosed in aforementioned Japanese Laid-open Patent Publication (kokai) No. H10-8246. Specifically, a horizontal part of a circular arc magnetic field generates a magnetron-mode electromagnetic field in the vicinity of the surface of a peripheral edge portion of each of the facing targets 110a and 110b. Also, a magnetic field extending between the facing targets 110a and 110b generates a facing-mode electromagnetic field around each of the facing targets 110a, 100b and the space provided between the facing targets 110a and 110b. As a result, high-density plasma is generated over the entire surface of each of the targets 110a and 110b. In the case of the target unit 100e, which has a target but does not have magnetic field generation means, since magnetic flux distribution induced by the magnetic field extending from one target to the other between the target units 100a and 100b is present adjacently to the target surface thereof, a mirror-type magnetron-mode electromagnetic field is generated in the vicinity of the target surface of the target unit 100e. As a result, high-density sputtering plasma is generated above the target surface.

The closing units 100c and 100d are attached to the support frame 61 to thereby be electrically connected to an anode; i.e., the vacuum chamber vessel. Thus, the closing units 100c and 100d are substantially not involved in sputtering and merely serve as shutters against sputtered particles.

The thus-configured box-type sputtering unit 60 is attached to a wall of the vacuum chamber vessel such that the opening portion 62 opens to the interior of the vacuum chamber vessel. Also, substrate holding means is disposed within the vacuum chamber vessel so as to hold a substrate in opposition to the opening portion 62 with a predetermined distance established therebetween. An evacuation port is provided on a vacuum chamber wall located behind the substrate holding means. The power unit 12 is connected to the target units 100a, 100b, 100e and the vacuum chamber vessel such that the grounded vacuum chamber vessel serves as an anode while the target units 100a, 100b, and 100e serve as cathodes in a manner similar to that shown in FIG. 2A.

The apparatus of the second embodiment can form a film in a manner similar to that in the case of the apparatus of the first embodiment. Specifically, after the vacuum chamber vessel is evacuated through an evacuation port by use of an evacuation system, sputtering gas, such as argon, is introduced into the vacuum chamber vessel through the introduction ports located around the target unit 100e by use of gas introduction means. The power unit 12 supplies sputtering power such that the vacuum chamber vessel serves as an anode while the targets 110a, 110b, and 110e serve as cathodes. As a result, sputtering plasma is generated and confined within an internal discharge space of the sputtering unit 60 by means of a magnetic field generated by the permanent magnets 130a and 130b of the magnetic field generation means. The sputtering plasma effects sputtering of the targets 110a, 110b, and 110e. Sputtered particles, together with sputtering gas particles, are transferred via the opening portion 62 to the high-vacuum vacuum chamber vessel, which is evacuated from behind the substrate. As a result, a film having a composition corresponding to that of the targets 110a, 110b, and 110e is formed on the substrate facing the opening portion 62.

The apparatus of the present embodiment yields the following effect in addition to that yielded by the apparatus of the first embodiment. Since the discharge space is closed except for an opening portion thereof, the efficiency of deposition on a substrate is improved. Since particles are temporarily confined within the discharge space, uniformity in speed and directivity of particles is improved. Furthermore, since the vacuum chamber vessel may house only the substrate holding means, the vacuum chamber vessel can be greatly reduced in size. As a result, the apparatus becomes compact and evacuation time is greatly shortened. Thus, the apparatus of the present embodiment yields excellent effects that cannot be yielded by a conventional laterally-opened facing-targets-type sputtering apparatus.

Experiments conducted by use of the facing-targets-type sputtering apparatus according to the present invention and Comparative Experiment will next be described.

Experiment 1

In Experiment 1, the apparatus of FIG. 2 was configured such that the facing targets 110a and 110b are made of aluminum (Al) and each assume a rectangular profile measuring 100×150×5 mm; and the distance between the facing targets 110a and 110b is 120 mm. A DC-RF power supply serving as a sputtering power supply was configured such that a DC power supply (DCG100, product of ENI) is combined with an RF power supply (HFS-40-005A, a product of Nihon Koshuha Co., Ltd.) via a matching circuit (a filter). The frequency of the RF power supply was 40 MHz.

The electron reflection means 170a was made of the same material as that of the targets 110a and 110b; i.e., an aluminum plate.

After the vacuum chamber vessel was evacuated to an ultimate pressure of $5 \times 10^{-5}$ Pa, argon (Ar) gas serving as sputtering gas was introduced into the vacuum chamber vessel, followed by formation of an Al film on a silicon wafer. In the course of film formation, the relationship between RF power and a discharge voltage (V) with a gas pressure ($P_{Ar}$) as a parameter was studied as follows.

At a gas pressure of 0.109 Pa, 0.048 Pa, or 0.012 Pa, the discharge voltage was measured while the applied RF power was varied with the applied DC power being maintained at a constant level of 250 W. The test results are shown in FIG. 5.

Figure 5:
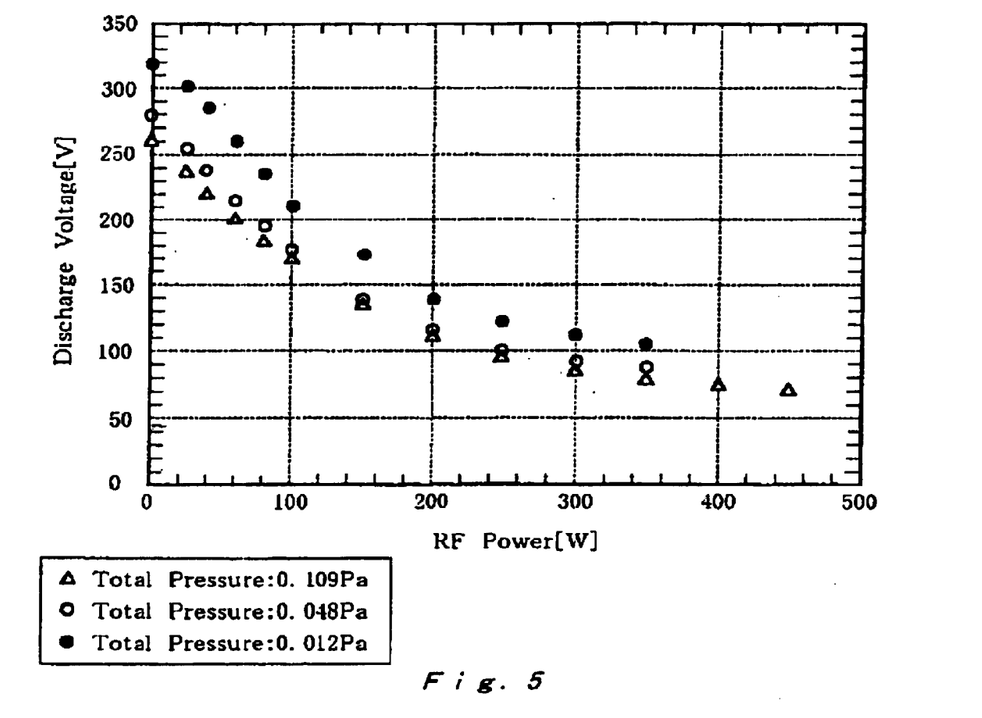
FIG. 5 is a graph showing the results of Experiment 1.

As shown in FIG. 5, a change in RF power causes the discharge voltage to vary greatly while the gas pressure was varied as a parameter. For example, at a gas pressure of 0.109 Pa, addition of an RF power of 100 W produces a discharge voltage of 165 V; addition of an RF power of 300 W produces a discharge voltage of 80 V; and addition of an RF power of 450 W produces a discharge voltage of 70 V. That is, addition of RF power causes the discharge voltage to decrease to a fraction of 260 V, which is a discharge voltage value observed when only DC power is applied (a discharge voltage value at an applied RF power of zero in FIG. 5). A similar tendency is observed at a gas pressure of 0.048 Pa or 0.012 Pa. Especially, even at a low gas pressure of 0.012 Pa, a discharge voltage of lower than 250 V can be realized with addition of an RF power of 80 W.

Comparative Experiment

Comparative Experiment was conducted while using a commercially available facing-targets-type sputtering apparatus FTSR-2LS (product of Osaka Vacuum, Ltd.), whose configuration is similar to that of the conventional facing-targets-type sputtering apparatus of FIG. 1. The DC-RF power supply used in Experiment 1 was also used as a sputtering power supply.

First, discharge characteristics were examined while a DC power of 250 W was supplied as in Experiment 1. At a gas pressure lower than 0.5 Pa, discharge was unstable, indicating a gas pressure of stability limit is 0.5 Pa. At a gas pressure of 0.5 Pa, the discharge voltage was 340 V.

Figure 6:
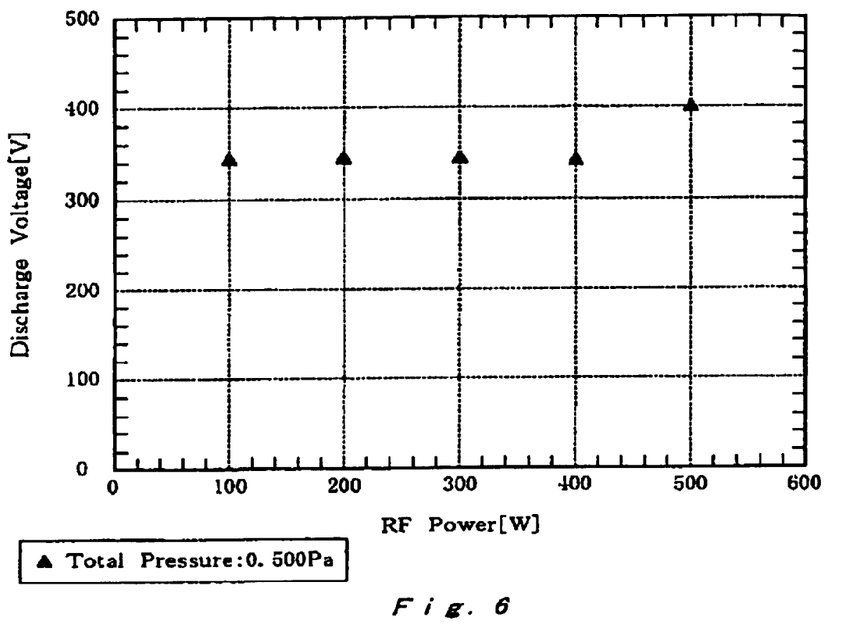
FIG. 6 is a graph showing the results of Comparative Experiment.

Thus, at a gas pressure of 0.5 Pa, the discharge voltage was measured while the applied power was varied in the following manner: the applied RF power was varied while the applied DC power was maintained at a constant level of 250 W as in Experiment 1. The test results are shown in FIG. 6. As shown in FIG. 6, even when the RF power is applied, the discharge voltage remains almost unchanged. Specifically, addition of an RF power of 100 W produces a discharge voltage of 340 V; addition of an RF power of 300 W produces a discharge voltage of 340 V; and addition of an RF power of 500 W produces a discharge voltage of 400 V. In contrast to Experiment 1, addition of RF power shows a slightly increasing tendency of discharge voltage.

As seen from the above test results, as compared with the conventional facing-targets-type sputtering technology, the sputtering technology of the present invention can decrease the discharge voltage to a fraction of a conventional level under the pressure of one order or more lower than a conventional level. A decrease in discharge voltage decreases kinetic energy of recoiled gas particles and greatly decreases energy of an accelerating electric field in a cathode sheath in relation to negative ions released from sputtered particles of target material of oxides or rare earth elements, thereby reducing influence of disturbance on a process of arranging sputtered particles on deposition surface and thus accelerating uniform formation of thin film structure.

Experiment 2

In Experiment 2, the box-type sputtering unit 60 of FIG. 3 was configured such that the targets 110a and 110b of the facing target units 100a and 100b are made of copper (Cu) and each assume a rectangular profile measuring 100×240×5 mm; the target 110e of the target unit 100e is made of copper (Cu) and assumes a rectangular profile measuring 90×230×5 mm; and the distance between the facing targets 110a and 110b is 120 mm. A sputtering power supply was configured such that a DC power supply (DCG100, product of ENI) is combined with an RF power supply (HFS-010W, product of Nihon Koshuha Co., Ltd.) via a matching circuit. The frequency of the RF power supply was 13.54 MHz.

After the vacuum chamber vessel was evacuated to an ultimate pressure of $5 \times 10^{-5}$ Pa, argon (Ar) gas serving as sputtering gas was introduced into the vacuum chamber vessel, followed by formation of a Cu film on a silicon wafer. In the course of film formation, the relationship between RF power and a discharge voltage was studied as follows.

At a gas pressure of 0.03 Pa, the discharge voltage was measured while the applied RF power was varied with the applied DC power being maintained at a constant level of 500 W. At applied RF powers of 0 W (only DC power was applied), 100 W, 300 W, and 500 W, discharge voltages of 420 V, 356 V, 246 V, and 173 V were produced. That is, as in Experiment 1, addition of RF power causes the discharge voltage to decrease to a fraction of the level observed when only DC power is applied.

Accordingly, it has been confirmed that, also in the case of a facing-targets-type sputtering process using a box-type sputtering unit, the present invention enables stable discharge at a low applied voltage in a gas atmosphere of low pressure.

Experiment 3

Figure 7:
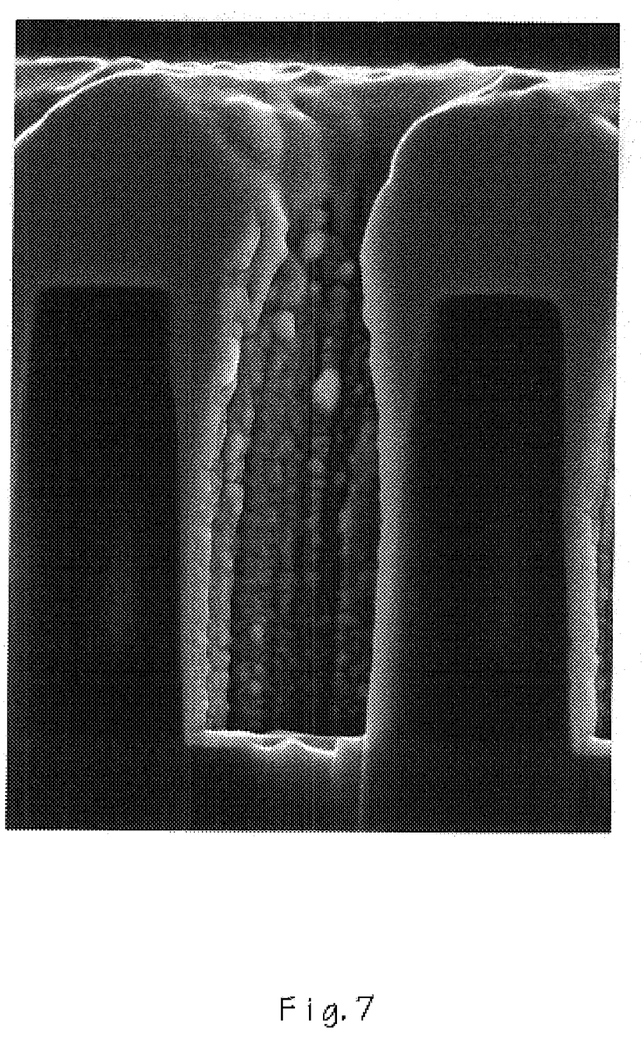
FIG. 7 is a photo of a scanning electron microscope (SEM) image showing the condition of a film formed on the wall of a hole in Experiment 3.

In order to study the applicability of the present invention to wiring of a large-scale integrated circuit (LSI) through utilization of controllability over sputtered particles expected to be yielded by the box-type sputtering process of Experiment 2, by use of the apparatus of Experiment 2, a Cu film was experimentally formed on the wall of a very small hole having a diameter of the order of submicrons employed in wiring on a semiconductor (LSI) device. Specifically, as in the case of Experiment 2, a Cu film was formed on a substrate of Si for a semiconductor on which holes each having a depth of 1.3 microns and a bottom diameter of 0.52 microns are formed, under the following conditions: Ar gas pressure 0.005 Pa; application of a combined power of a DC power of 250 W and an RF power of 400 W; and discharge voltage 400 V. The condition of the Cu film formed on the walls of the holes was examined by use of a scanning electron microscope (SEM). A photo of an obtained SEM image is shown in FIG. 7. As shown in the photo, the Cu film is formed on the entire wall including the bottom of the hole. The Cu film has a thickness of 60 nm on the bottom of the hole, a thickness of 80–200 nm on the wall of the hole, and an overhang of about 100 nm at the inlet of the hole. The film was formed on the walls of the holes as a result of deposition of the film having a thickness of about 550 nm on the substrate surface.

The above test results indicate that Cu atoms sputtered under high vacuum (low pressure) according to the present invention obtain high kinetic energy and enter a hole, thereby being densely deposited on the entire wall of the hole and thus forming wiring of superior property.

According to a conventional technology for forming a Cu film on the wall of a hole or trench, Cu atoms of low energy are re-sputtered at the interface of a substrate through utilization of gas pressure of 1 Pa or higher, high-frequency plasma, and a negative bias voltage applied to the interface of the hole or trench (Proceedings: The 61st Symposium of The Japan Society of Applied Physics, Hokkaido Institute of Technology, September, 2000, 5a-P8-5, 5a-P8-6). Because of occurrence of defect on a grain boundary and damage at the deposition interface due to re-sputtering the hole or trench, the conventional technology encounters difficulty in controlling conditions for forming a Cu film of high quality. Thus, there has been long-awaited an improvement in formation of a Cu film in relation to manufacturing high integrated and high dense LSIs.

By contrast, the present invention implements discharge under the gas pressure of two orders lower than the gas pressure of the conventional sputtering technology. Thus, Cu atoms sputtered from the target surface reach a trench or hole while maintaining kinetic energy associated with sputtering; and an abnormal plasma bombardment is not involved in the course of transition of Cu atoms; specifically, gaseous phase, diffusion on deposition surface, and then solidification. This is a conceivable reason for attainment of the above test results. A film to be formed according to the present invention does not involve defect on a grain boundary and is dense in morphology. Even a film having a thickness of about 5 nm can cover an interface uniformly and continuously to thereby be able to serve as a seed layer. Therefore, even a thin film whose thickness is not greater than one-tenth that shown in the photo of FIG. 7 can sufficiently exhibit the function of a seed layer.

What is claimed is:

1. A facing-targets sputtering method for producing a film on a substrate which comprises:
   (a) generating a magnetic field extending between two targets from one target to the other, the targets being disposed a predetermined distance away from each other, in such a manner as to surround a discharge space provided between the two targets, to thereby confine plasma within the discharge space by means of the magnetic field; and
   (b) performing sputtering under vacuum to form a film on a substrate disposed at a position beside the discharge space, wherein
   electrons are caused to be reflected into the discharge space by use of electron reflection means disposed around the corresponding targets, and
   power generated through superposition of high frequency power to direct current power is applied to the targets to effects the sputtering;
   wherein a film is formed at a gas pressure of 0.5 Pa or lower.

2. A facing-targets sputtering apparatus for producing a film on a substrate comprising:
   a box unit having a discharge space provided therein and having at least three openings formed in corresponding three side faces thereof including two facing side faces;
   a pair of target units disposed so as to cover the corresponding two facing openings, each unit having a target on the discharge space side;

a substrate holder for holding a substrate in such a manner so as to cause the substrate to face the opening remained open and be perpendicular to the pair of target units; and a power supply unit for supplying direct-current power and high-frequency power to the paired targets, wherein said paired target units each comprises:

a cooling block for holding the corresponding target on a surface thereof;

magnetic field generation means for generating a magnetic field in such a manner as to surround the discharge space; and electron reflection means for reflecting an electron to the discharge space disposed on the magnetic field generation means in such a manner as to surround the corresponding target.

3. A facing-targets sputtering apparatus according to claim 2, wherein the discharge space is evacuated at a gas pressure of 0.5 Pa or lower when a film is formed.

4. A facing-targets sputtering method for producing a film on a substrate which comprises:

(a) generating a magnetic field extending between two targets from one target to the other, the targets being disposed a predetermined distance away from each other, in such a manner as to surround a discharge space provided between the two targets, to thereby confine plasma within the discharge space by means of the magnetic field; and (b) performing sputtering under vacuum to form a film on a substrate disposed at a position beside the discharge space, wherein electrons are caused to be reflected into the discharge space by use of electron reflection means disposed around the corresponding targets, and power generated through superposition of high frequency power to direct current power is applied to the targets to effect the sputtering;

wherein the side faces of the discharge are closed except for a side face which faces the substrate.

5. A facing-targets sputtering method according to claim 4, wherein in addition to the magnetic field extending between the targets from one target to the other, a circular arc magnetic field is generated at a peripheral edge portion of each target.

6. A facing-targets sputtering method according to claim 4, wherein a film is formed at a gas pressure of 0.5 Pa or lower.

7. A facing-targets sputtering method according to claim 4, wherein a side face opposite to the side face facing the substrate is closed by a target unit.

8. A facing-targets sputtering method according to claim 4, wherein the electron reflection means and the targets are made of the same material.

9. A facing-targets sputtering method according to claim 4, wherein the targets are of Cu, a Cu alloy, Al, or an Al alloy.

10. A facing-targets sputtering method according to claim 9, wherein the film is a conducting film.

11. A facing-targets sputtering method according to claim 10, wherein the film is a metal film.

12. A facing-targets sputtering method according to claim 10, wherein the film is formed at a gas pressure of 0.05 Pa or lower.

13. A facing-targets sputtering method according to claim 4, wherein a sputtering unit comprising the facing targets is a box sputtering unit configured to close side faces of the discharge space except for a side face facing the substrate; and the film is formed at a gas pressure of 0.01 Pa or lower.

14. A facing-targets sputtering method according to claim 13, wherein a side face opposite to the side face facing the substrate is closed by a target unit.

15. A facing-targets sputtering method according to claim 14, wherein the film is of Cu, a Cu alloy, Al, or an Al alloy.

16. A facing-targets sputtering method according to claim 13, wherein the film is a metal film.

17. A facing-targets sputtering method according to claim 16, wherein the film is a wiring film of a semiconductor device.

* * * * *